United States Patent [19]
Adibi et al.

[11] Patent Number: 5,883,391
[45] Date of Patent: Mar. 16, 1999

[54] ION IMPLANTATION APPARATUS AND A METHOD OF MONITORING HIGH ENERGY NEUTRAL CONTAMINATION IN AN ION IMPLANTATION PROCESS

[75] Inventors: Babak Adibi, Santa Clara, Calif.; Jonathan Gerald England, Horsham; Stephen Moffatt, Bookham, both of United Kingdom; Jose Antonio Marin, Austin, Tex.

[73] Assignee: Applied Materials, Inc., Santa Clara, Calif.

[21] Appl. No.: 876,434

[22] Filed: Jun. 16, 1997

[30] Foreign Application Priority Data

Jun. 14, 1996 [GB] United Kingdom .................. 9612535

[51] Int. Cl.$^6$ .................................................. H01J 37/317
[52] U.S. Cl. ........................................................ 250/492.21
[58] Field of Search .......................... 250/492.21, 492.2, 250/251, 397

[56] References Cited

U.S. PATENT DOCUMENTS 4,539,217  9/1985  Farley .
5,319,212  6/1994  Tokoro .
5,747,936  5/1998  Harrison et al. .................. 250/492.21

FOREIGN PATENT DOCUMENTS 62-40369A  2/1987  Japan .

OTHER PUBLICATIONS

Babak Adibi et al., ION Implantation Technology—92, pp. 601–606, "Development and Applications of a Beam Energy Filter for the PI9200XJ High Current Implanter" (1992).

Primary Examiner—Kiet T. Nguyen
Attorney, Agent, or Firm—Boult Wade Tennant

[57] ABSTRACT

High energy neutral contamination in an ion implanter can be caused by beam ions neutralised as they are temporarily accelerated at an electrode before being decelerated again to the desired implant energy. This occurs for example in the decel lens arrangement which includes an electrode at a relatively high negative potential to provide the required focusing. The level of this contamination is monitored by measuring the current drain on this negative field electrode.

14 Claims, 2 Drawing Sheets

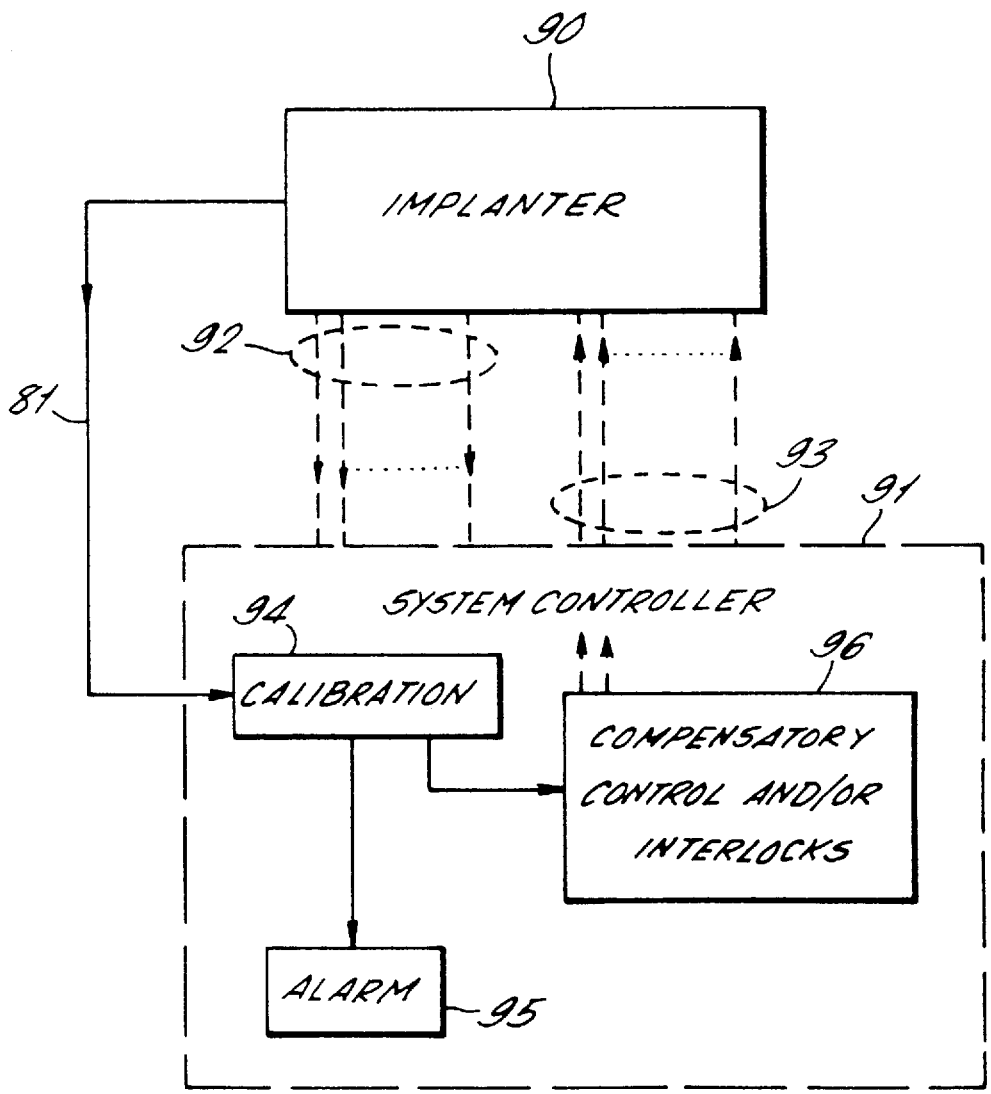

ION IMPLANTATION APPARATUS AND A METHOD OF MONITORING HIGH ENERGY NEUTRAL CONTAMINATION IN AN ION IMPLANTATION PROCESS

FIELD OF THE INVENTION

This invention relates to ion implantation apparatus and in particular the monitoring of high energy neutral contamination in ion implantation processes.

DISCUSSION OF PRIOR ART

Ion implantation is one of the standard processes employed in the manufacture of integrated circuit devices to modify the electrical properties of defined regions of a substrate of semiconductor material by doping these regions with a selected concentration of impurity atoms. The technique involves generating a beam of a preselected specie of ions and directing the beam towards a target substrate. The depth of the ion implant depends inter alia on the energy of the ion beam at the point of implantation at the substrate, that is the implant energy.

A typical implantation apparatus comprises a vacuum chamber, which may have a number of intercommunicating compartments. One compartment may comprise an ion source in which ions of the required specie are formed. Typical ion species used for implantation are boron ($B^+$), phosphorous ($P^+$) and arsenic ($As^+$). Ions from the ion source are extracted at an extraction energy selected to provide efficient operation of the ion source. Ions at the extraction energy are then transported through a flight tube at a constant transport energy. In the flight tube, the ions are passed through a mass selector, typically taking the form of a magnet and associated mass selection slits. Ions of a selected mass then emerge from the flight tube at an exit aperture, still at the transport energy.

For efficient extraction from the ion source and subsequent transport through the flight tube, the extraction energy and subsequent transport energy of the ions is typically between 10 and 20 keV. At lower extraction energies extraction efficiencies tend to fall off and at higher energies more powerful and/or physically larger magnets are required.

In prior art ion implantation apparatus, implant energies up to 160 keV or greater have been required and it has been standard practice to accelerate the ions emerging from the flight tube to these higher implant energies. This procedure has been called "post mass selection acceleration" or "post-accel" for short.

More recently, there has been a growing requirement for implantation at lower energies, even below 10 keV. This has led to the suggestion of post mass selection deceleration processes ("post-decel" for short).

A problem with all ion implantation processes is energy contamination. In order to provide the desired structure of doped material in the substrate being treated, it is important that the implanting ions have a predictable and controlled energy. A problem arises with implantation apparatus if ions in the ion beam become neutralised, e.g. by electron exchange with an atom of residual gas in the vacuum chamber, before they reach their final implant energy. Once neutralised, the atom of the desired implant specie is no longer effected by the accelerating and decelerating fields and will therefore continue at its previous energy. If the ion is neutralised when travelling in a direct line to the target substrate, the neutralised atom will implant in the target substrate at the energy it had immediately after becoming neutralised.

Where implantation apparatus is operated with post-decel, contamination with high energy neutrals is a particular problem, resulting from ions in the beam being neutralised between when the ions emerge from the magnetic field and are travelling in a direct line to the target substrate and when the ions have been fully decelerated by the subsequent decelerating electric field.

It is known that the number of neutrals formed in the ion beam is dependent on the residual gas pressure within the vacuum chamber, which directly effects the number of electron exchange collisions resulting in ions being neutralised. However, some residual gas pressure is desirable since collisions between the beam ions and residual gas atoms also produce free electrons in the region of the ion beam which serve to reduce the space charge of the ion beam, which in turn reduces the tendency of the ion beam to "blow up" due to the mutual repulsion of the positively charged ions in the beam.

A particular problem of high energy contamination on the target substrate can arise when the ion beam is temporarily accelerated on emerging from the exit aperture of the flight tube before being subsequently decelerated down to the implant energy. Any ions neutralised whilst at the temporary higher energy will, of course, continue to implant in the target substrate at this higher energy. Since this energy of contaminating neutrals is even higher than the transport energy, the effect on the implanted substrate can be more serious.

Ions emerging from the exit aperture of the flight tube will be temporarily accelerated to a higher energy if there is present a field electrode between the exit aperture and the target substrate which is at a negative potential difference relative to the flight tube. Such a negative field electrode may be used as an electron suppression electrode designed to prevent electrons in the ion beam emerging from the flight tube from being drawn out of the beam in the flight tube by the deceleration field which reduces the energy of the ions down to the implant energy. However, a negative field electrode at a relatively low potential, several kilovolts more negative than the potential of the flight tube, may be employed in applications where the field electrode, in combination with other electrodes, is intended to provide a focusing field opposing the tendency of the ion beam to blow up through space charge effects before reaching the target substrate. An arrangement which uses such a relatively low potential field electrode is disclosed in United Kingdom Patent Application No. 9522883.9.

SUMMARY OF THE INVENTION

According to one aspect of the present invention, a method of monitoring in an ion implantation process high energy neutral contamination of an ion beam caused by beam ions neutralised as they are temporarily accelerated at a field electrode before being decelerated again to the desired implant energy, comprises the step of monitoring the current drain on the field electrode to indicate the flow of said neutralised ions to the target. It has been discovered that the current drain on this field electrode provides a good indication of the amount of contamination of the target substrate, especially at energies up to the maximum energy to which beam ions are accelerated at the field electrode. This may be explained by appreciating that a beam ion is neutralised by electron exchange with a residual gas atom in the vacuum chamber. This causes the residual gas atom to become ionised but typically to remain at a low energy. These low energy residual gas ions are then attracted to the field electrode where they are neutralised producing a corresponding current drain on the electrode. As a result, this electrode current drain provides a direct measure of the energy contamination on the target substrate at energies above the transport energy of ions through the flight tube.

The method of the invention may include the step of precalibrating said field electrode current drain as a measure of said neutralised ion flow.

In a preferred arrangement, the method includes the steps of comparing said monitored current drain with a threshold value selected to correspond to a maximum tolerable level of said high energy neutral contamination, and providing an alarm signal if said monitored current exceeds said threshold value. Alternatively, the monitored current drain may be integrated during an implantation process run and the integrated value may be compared with a threshold function during the course of the run to generate an alarm signal.

A system interlock may be operated to halt the implantation process in response to the alarm signal.

In another aspect, the present invention provides ion implantation apparatus comprising a vacuum chamber and within the vacuum chamber:
 a holder for a target substrate to be implanted,
 a source of ions,
 a flight tube to carry a beam of ions from said source at a transport energy, said flight tube having an exit aperture and a mass selector to select only ions of a desired mass for delivery in a beam at said transport energy from said exit aperture of the flight tube,
 a first voltage potential supply connected to provide a deceleration field between said exit aperture and said substrate holder to decelerate ions in the beam to an implant energy at the holder,
 a field electrode located between said exit aperture and said substrate holder,
 a second voltage potential supply connected to provide a potential difference between said field electrode and said exit aperture which temporarily accelerates ions in the beam above said transport energy,
 a current meter to provide a signal indicating the current drain on said field electrode,
 and means responsive to said current drain signal to provide an indication of the quantity of accelerated neutral particles in the beam leaving the suppression electrode.

Said means responsive may include calibration means which is precalibrated to be responsive to said current drain signal to provide a signal indicating said neutral particle flow.

In one embodiment, said means responsive includes means for comparing said monitored current drain with a threshold value selected to correspond to a maximum tolerable level of said high energy neutral contamination, and means providing an alarm signal if said monitored current drain exceeds said threshold value. The apparatus may include a system interlock operable to halt the implantation process in response to said alarm signal.

In a preferred embodiment, said exit aperture of the flight tube has a screening element at the flight tube potential, and said field electrode is located adjacent to said screening element. A deceleration electrode may be included adjacent to and downstream of said field electrode, said deceleration electrode being connected to be at substantially the potential of the target holder.

The arrangement of the present invention is most useful when said second voltage potential supply is arrange to bias said field electrode negatively relatively to said exit aperture by at least 5 kV. In practice, said second voltage potential supply may be arranged to bias said field electrode negatively relative to said deceleration electrode by between 5 kV and 40 kV. Conveniently the field electrode is held at a fixed voltage relative to said deceleration electrode of between –5 kV and –30 kV, more particularly between –15 kV and –30 kV. In a particular arrangement, the field electrode is held at about –25 kV relative to said deceleration electrode.

BRIEF DESCRIPTION OF THE DRAWINGS

Examples of the present invention will now be described with reference to the drawings in which:

FIG. 2 is a block schematic diagram illustrating the control system for the implanter of FIG. 1.

DESCRIPTION OF PREFERRED EMBODIMENTS

Figure 1:
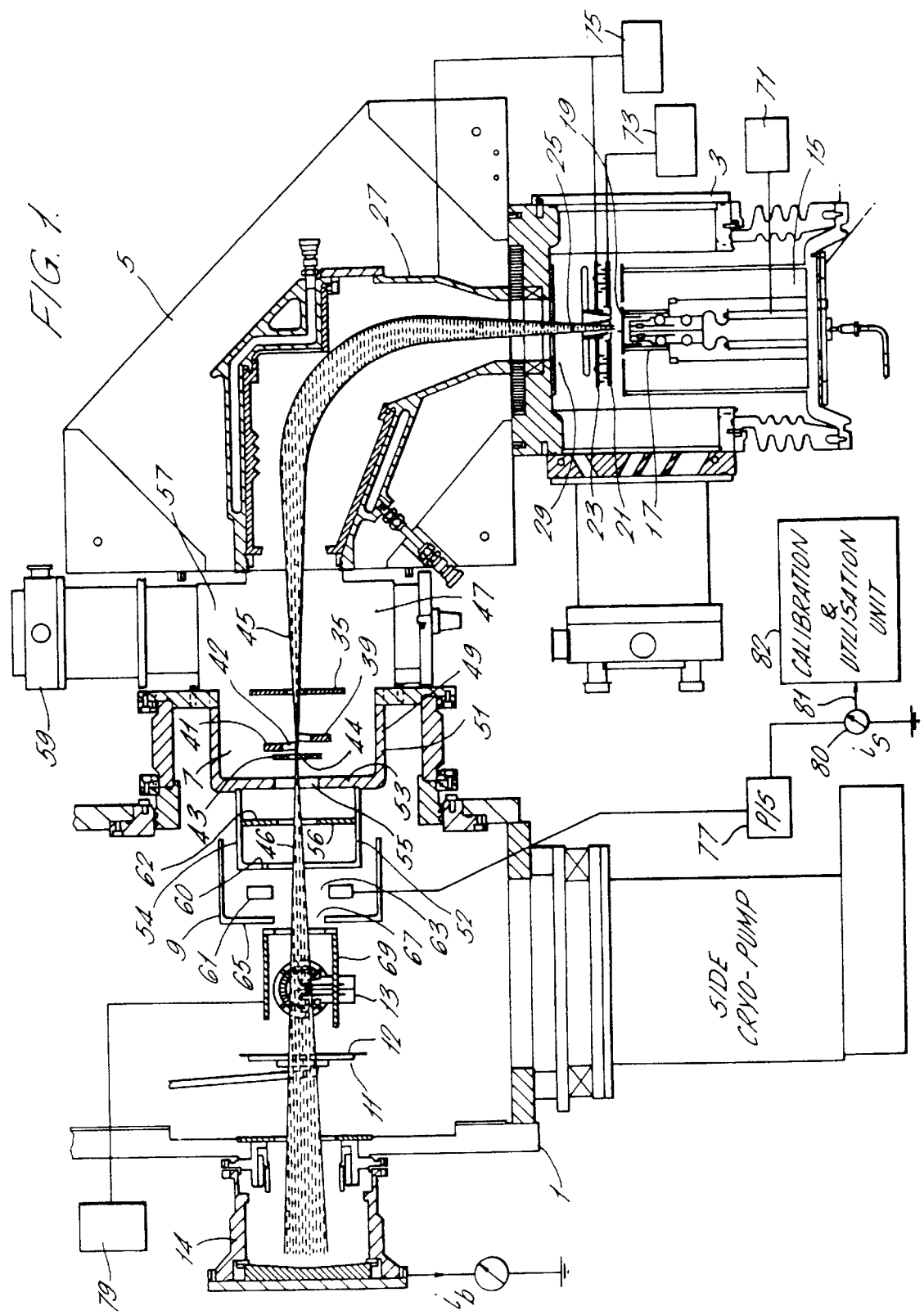
FIG. 1 is a schematic view partially in cross-section of an ion implantation apparatus.

Referring to FIG. 1, an ion implanter 1 comprises an ion beam generator 3 for generating a beam of ions, a magnet 5 adjacent the ion beam generator for resolving spatially the beam ions according to their mass, an ion selector 7 disposed adjacent the analysing magnet 5 for selecting a specie of ions to be implanted into a target substrate and for rejecting other ions in the spatially resolved beam from the magnet, an electrode assembly 9 disposed adjacent the ion selector 7 for controlling the final energy of the ion beam before implantation, a support 11 spaced from the electrode assembly 9 for supporting a target substrate 12 to be implanted with beam ions and an electron generator 13 disposed between the electrode assembly 9 and the substrate support 11 for introducing electrons into the ion beam near the target surface to neutralise the beam and wafer surface. An ion beam collector 14 is positioned downstream of the substrate support 11 which serves as a beam stop and ion current detector for dosimetry measurements.

In more detail, the ion beam generator 3 comprises an ion source 15 including an arc chamber 17 having an exit aperture 19 formed in the front face thereof. A pair of extraction electrodes 21,23 are spaced from the exit aperture 19 for extracting ions from the arc chamber and forming an ion beam 25. The extraction electrode 21 which is closest to the exit aperture 19 of the arc chamber serves as a suppression electrode to prevent electrons forward of the beam generator from flowing to the arc chamber.

A flight tube 27 is positioned between two poles (only one shown) of the mass analysing magnet 5 for receiving the ion beam from the beam generator 3 and for controlling the energy (the transport energy) of the ion beam during its passage between the poles of the magnet 5, which is determined by the potential difference between the flight tube 27 and the ion source 15. In this particular embodiment, the magnetic field strength of the analysing magnet and the energy of the ion beam through the magnet are chosen so that ions having an appropriate mass are deflected through approximately 90° and the flight tube 27 is configured accordingly, with the exit aperture 55 of the flight tube 27 being approximately orthogonal to the entrance aperture 29.

The ion selector 7 comprises a series of discrete elements 35, 39, 41 and 43 which are spaced apart along the beamline 45 and define a series of apertures which, in combination, select ions of the correct mass to be implanted in the target substrate while rejecting other spatially resolved ions which pass through the analysing magnet 5. In this particular embodiment, the ion selector 7 comprises a plate electrode 35 which rejects most of the unwanted ion species from the magnet, a pair of elements 39, 41, which together define a variable width mass resolving slit which passes only the selected ion specie, and a further element 43 which defines the height of the ion beam. However, the number of mass resolving elements and their configuration may be varied.

The ion selector assembly is housed in a chamber 47 between the magnet and the electrode assembly 9 forming an extension of the flight tube 27. The mass resolving chamber wall 49 comprises a part 51 which extends in the direction of the beamline and defines a generally cylindrical envelope, and a transverse part 53 adjacent the cylindrical part 51 which constitutes a plate electrode disposed transverse to the beam line and defines the exit aperture 55 through which the beam can pass, the aperture 55 being adjacent the final element 43 of the ion selector 7.

In this particular embodiment, a vacuum port 57 is formed in the chamber wall 49 near the analysing magnet 5 which is connected to a vacuum pump 59 for evacuating the chamber 47, although in another embodiment this vacuum port may be omitted.

A screening assembly 52 is positioned between the exit aperture 55 of the mass resolving chamber 47 and the electrode assembly 9 to reduce penetration of the electric field from the electrode assembly 9 into the mass resolving chamber 47 through the exit aperture 55.The screening assembly 52 comprises a cylindrical electrode 54, and a field defining electrode 56. The cylindrical electrode 54 is arranged coaxially with the exit aperture 55 and with one end 58 positioned adjacent and connected to the transverse part (or front end) 51 of the mass resolving chamber wall 49. The cylindrical electrode 54 extends forward of the mass resolving chamber 47 and may have an inwardly extending radial flange 60 formed near or at the other end of the cylindrical electrode 54 to provide additional screening.

The field defining electrode 56, which may or may not be used, comprises a circular plate with a square aperture 62 formed in the centre thereof. The field defining electrode 56 is mounted within and supported by the cylindrical electrode 54 and is positioned about midway between the ends of the cylindrical electrode 54 (although this may vary) and transverse to beam line 45. The square aperture 62 tapers gently outwards towards the electrode assembly 9. In this example, the width of the square aperture is about 60 mm. The cylindrical electrode and the field defining electrode may each be made of graphite or other suitable material.

The electrode assembly 9 for controlling the implant energy of the ion beam is situated just beyond the screening assembly 52, and comprises a field electrode 61 and a deceleration electrode 65. The field electrode 61 defines a rectangular aperture 63 adjacent and substantially coaxial with the exit aperture of the screening assembly 52. The deceleration electrode 65 is disposed generally transverse to the beamline 45 and defines a further aperture 67 through which the ion beam can pass, this further aperture 67 being disposed adjacent the field electrode aperture 63. The field electrode and the deceleration electrode may each be made of graphite or other suitable material.

In this embodiment, the electron injector 13 comprises a plasma flood system which introduces low energy electrons into the ion beam near the target. The plasma flood system includes a guide tube 69 through which the ion beam can pass from the deceleration electrode aperture 67 to the target substrate 12, and which both maintains the low energy electrons in the vicinity of the ion beam and screens the portion of the ion beam between the deceleration electrode aperture and the wafer from stray electric fields.

The ion implanter further comprises an ion source voltage supply 71 for biasing the ion source, a suppression electrode voltage supply 73 for biasing the suppression electrode 21, a flight tube voltage supply 75 for biasing the flight tube 27 and the mass resolving chamber 47 and the other extraction electrode 23, a field electrode voltage supply 77 for biasing the field electrode 61 of the electrode assembly 91, and a plasma flood voltage supply 79 for biasing the electron confining electrode 69. The deceleration electrode 65, the target substrate support 11 and the substrate 12 are maintained at ground potential, which facilitates handling of the target substrate, simplifies the support assembly, and serves as a convenient reference potential for the other electrodes.

A method of operating the ion implanter to implant ions at low energy will now be described with reference to a specific example for illustrative purposes only.

The ion implantation energy is determined by the potential difference between the substrate 12 and the ion source 15. As the substrate is maintained at ground potential, the ion source voltage supply 71 is biased positively with respect to ground by an amount which determines the ion implantation energy. For example, for a 2 keV implant, the ion source voltage supply is biased to +2 kV. The transport energy of the ion beam through the analysing magnet 5 and the mass resolving chamber 47, which is also referred to as the extraction energy of the ion beam, is determined by the potential difference between the ion source 15 and the flight tube, which is controlled by the flight tube voltage supply 75. Thus, for example, to transport the ion beam at an energy of 10 keV through the flight tube, the flight tube is biased at −10 kV relative to the ion source or −8 kV relative to ground. The ion beam is transported with substantially constant energy through the analysing magnet and different ionic species within the ion beam are resolved spatially by the magnet according to their mass. The spatially resolved beam then passes into the mass resolving chamber, where the beam first passes through a predefining aperture defined by the plate electrode 35 closest to the analysing magnet 5. The plate_electrode 35 acts as a course, first stage filter for the spatially resolved beam and blocks a proportion of the spatially resolved ion species which are not required in the implant. The second and third elements 39 and 41 spaced from the analysing magnet 5, and which are displaced axially from one another along the beamline, define a variable width mass resolving slit 42, whose position can be varied in a direction transverse to the beamline, for selecting from the filtered beam the ion species to be implanted.

As an example, in a boron implant the spatially resolved beam leaving the analysing magnet may contain $BF_3$, $BF_2$, BF, B and F ions and the molecular and boron ions will contain either isotope of boron, $^{10}B$ and $^{11}B$. Thus, for a "boron 11" implant the predefining element 35 and the mass resolving elements 39, 41 will filter out all ionic species except $^{11}B$.

As the beam traverses the mass resolving chamber, the energy of the beam is maintained constant, in this example 10 keV. The 10 keV mass resolved beam 46 passes through the exit aperture 55 of the mass resolving chamber 47, through the screening assembly 52 to the electrode assembly 9.

A potential is applied to the field electrode 61 so that the field electrode is negative relative to the mass resolving chamber 47. The magnitude of the potential applied to the cylindrical electrode 61 is sufficient to establish an electrostatic focusing field in the region between the final aperture 67 of the grounded deceleration electrode 65 and the aperture of the flange 60 of the screening electrode 54. The inventors have found that a potential on the field electrode of between −5 kV and −30 kV with respect to the potential of the deceleration electrode 65 is sufficient to establish the required focusing field at the final aperture 67 to maintain the beam ions within the beam between the final aperture 67 and the target substrate. However, preferably the field electrode 61 is held at −25 kV.

As the flight tube and the mass resolving chamber are at −8 kV for an implant energy of 2 keV, the field electrode 61 is biased to a potential lower than the potential of the flight tube and serves to prevent electrons in the mass resolving region from being drawn to the deceleration electrode 65, which would destroy space charge neutralisation in this region causing beam expansion and loss of current.

In the present example, as the mass resolved beam 46 approaches the field electrode 61, the beam is briefly accelerated above the transport (extraction) energy of 10 keV to an energy defined substantially by the potential difference between the ion source 15 and the field electrode 61, typically 25 keV. The beam passes through the field electrode aperture 63 and is then decelerated to substantially the required implant energy in the gap between the field electrode aperture 63 and the final aperture 67 of the deceleration electrode 65. At the same time, a net focusing force is applied to the ion beam in the region between the flange 60 and the field electrode 61, in the region between the field electrode 61 and the deceleration electrode 65, and just beyond.

The ion beam then passes into the region between the final aperture 67 and the target substrate. In this region, the ion beam is transported to the substrate at substantially the required implant energy. Expansion of the now, low velocity beam is minimised by flooding the beam with low energy electrons, by means of the plasma flood system 13. The plasma flood system also minimises surface charging of the target substrate during ion implantation and simultaneously reduces the potential of the ion beam, again to minimise the extent to which the beam expands before reaching the substrate.

As the ion beam travels from the ion source 3 to the target substrate 12, ions in the beam can be neutralised by picking up an electron. Between the ion source 3 and the region of the plasma flood system 13, the usual mechanism for neutralising beam ions is electron exchange with a residual gas atom. Once a beam ion is neutralised it is no longer effected by magnetic or electric fields. Thus, any neutral atoms formed before beam ions are travelling in direct line of sight to the target substrate will continue to fly in the direction of the beam ion when neutralised and will be absorbed in the flight tube or the mass selection chamber 47 and will not emerge through the mass selecting elements 41 and 42 in the beam emerging through the exit aperture 55. However, any beam ions neutralised once they are travelling in direct lines to the target substrate will continue with the energy at neutralisation to implant in the substrate at this energy.

Beam ions neutralised before emerging from the cylindrical electrode 54 will have the transport energy, typically 10 keV. These neutral atoms will produce energy contamination in the substrate at this energy, penetrating further than the ions at the desired implant energy, typically 2 keV.

However, a more serious energy contamination occurs at a higher energy due to ions which are neutralised as they are temporarily accelerated past the field electrode 61. Such neutral atoms formed in this region may have energies up to 25 keV.

In the example of the present invention shown in FIG. 1, the quantity of ions being neutralised at this higher energy as they are temporarily accelerated past the field electrode 61 is monitored by monitoring the current drain on the field electrode 61.

As explained previously, beam ions which are neutralised as they pass the field electrode 61 experience electron exchange with a residual gas atom, resulting in a low energy residual gas ion which is positively charged. Such low energy residual gas ions are attracted to the negative potential on the field electrode 61, at which they are discharged to contribute to the current drain on the electrode 61.

In FIG. 1, a current meter 80 provides a signal on a line 81 indicative of the current drain on the power supply 77 maintaining the field electrode 61 at the desired potential. The current drain signal on the line 81 is supplied to a calibration and utilisation unit 82.

In the simplest arrangement the calibration and utilisation unit 82 may be a threshold detector which has been set to generate an alarm signal if the signal on the line 81 indicates the current drain on the electrode 61 exceeds a predetermined threshold value. This predetermined threshold value would correspond to a maximum tolerable level of high energy contamination in the ion beam being delivered to the target substrate 12. This predetermined maximum current drain value would be determined empirically. The alarm signal could be an audible or visual alarm on the implanter apparatus, but more preferably would take the form of an electronic signal supplied to the implanter system controller.

FIG. 2 illustrates in very general form the system controller of a typical ion implantation apparatus. The implantation apparatus itself is indicated generally by the box 90 and the system controller is shown generally by the box 91 represented in dashed lines. The system controller receives a number of system parameter signals from the implanter 90 on lines 92 and delivers to the implanter a number of system control output signals on lines 93. In FIG. 2, the line 81 supplying the signal indicative of the current drain on the field electrode 61 is shown supplying the signal from the implanter 90 to the system controller 91. Within the controller 91, the signal on line 81 may be delivered to a calibration unit 94. In the calibration unit, the current drain signal may be scaled or otherwise converted so as to provide a representation of the level of high energy contamination of the ion beam being delivered to the target substrate. The factors used in the scaling or conversion functions are determined empirically in a precalibration process.

Alternatively, a precalibration process may be used to determine threshold levels to indicate maximum tolerable levels of contamination in the beam.

If the current drain signal on the line 81 is determined in the calibration unit 94 to show a level of high energy contamination in excess of the tolerable maximum, an alarm signal is generated as supplied to alarm unit 95, which may provide visual or audible alarm signals to machine operators.

In addition, signals from the calibration unit 94 are supplied to compensatory control and/or interlock unit 96 within the system controller. In one arrangement, this unit is arranged to respond to signals from the calibration unit 94 indicating an excessive level of high energy contamination by operating system interlocks to halt the implantation process.

In other arrangements, the unit 96 may be arranged to respond to high levels of current drain on the electrode 61 by adjusting other system parameters with a view to controlling the level of high energy neutral contamination in the beam. For example, the beam current may be reduced or the implant suspended to allow the vacuum in the field electrode region to recover.

Although the example described above relates to a post-decel implanter with a beam focusing field electrode, the invention may also be used in other arrangements where beam ions are accelerated past a field electrode.

We claim:

1. A method of monitoring in an ion implantation process high energy neutral contamination of an ion beam caused by beam ions neutralised as they are temporarily accelerated at a field electrode before being decelerated again to the desired implant energy, comprising the step of monitoring the current drain on the field electrode to indicate the flow rate of said neutralised ions to the target.

2. A method as claimed in claim 1 and including the step of precalibrating said field electrode current drain as a measure of said neutralised ion flow.

3. A method as claimed in claim 1 including the steps of comparing said monitored current drain with a threshold value selected to correspond to a maximum tolerable level of said high energy neutral contamination, and providing an alarm signal if said monitored current exceeds said threshold value.

4. A method as claimed in claim 3 including the step of operating a system interlock to halt the implantation process in response to said alarm signal.

5. Ion implantation apparatus comprising a vacuum chamber containing:

a holder for a target substrate to be implanted, a source of ions, a flight tube to carry a beam df ions from said source at a transport energy, said flight tube having an exit aperture and a mass selector to select only ions of a desired mass for delivery in a beam at said transport energy from said exit aperture of the flight tube, a first voltage potential supply connected between said exit aperture and said substrate holder to decelerate ions in the beam to an implant energy at the holder, a field electrode located between said exit aperture and said substrate holder, a second voltage potential supply connected to provide a potential difference between said field electrodes and said exit aperture which temporarily accelerates ions in the beam above said transport energy, a current meter to provide a signal indicating the current drain on said field electrode, and means responsive to said current drain signal to provide an indication of the quantity of accelerated neutral particles in the beam leaving the field electrode.

6. Ion implantation apparatus as claimed in claim 5 wherein said means responsive includes calibration means which is precalibrated to be responsive to said current drain signal to provide a signal indicating said neutral particle flow.

7. Ion implantation apparatus as claimed in claim 5, wherein said means responsive includes means for comparing said current drain signal with a threshold value selected to correspond to a maximum tolerable level of said quantity of accelerated neutral particles, and means providing an alarm signal if said current drain signal exceeds said threshold value.

8. Ion implantation apparatus as claimed in claim 7 including a system interlock operable to halt the implantation process in response to said alarm signal.

9. Ion implantation apparatus as claimed in claim 8, and including a deceleration electrode adjacent to and downstream of said field electrode, said deceleration electrode being connected to be at substantially the potential of the target holder.

10. Ion implantation apparatus as claimed in claim 9, wherein said second voltage potential supply is arranged to bias said field electrode negatively relative to said exit aperture by at least 5 kV.

11. Ion implantation apparatus as claimed in claim 9, wherein said second voltage potential supply is arranged to bias said field electrode negatively relative to said deceleration electrode by between 5 kV and 40 kV.

12. Ion implantation apparatus as claimed in claim 11, wherein the field electrode is held at a fixed voltage relative to said deceleration electrode of between −5 kV and −30 kV.

13. Ion implantation apparatus as claimed in claim 12, wherein the field electrode is held at about −25 kV relative to said deceleration electrode.

14. Ion implantation apparatus as claimed in claim 5, wherein said. exit aperture of the flight tube has a screening element at the flight tube potential, and said field electrode is located adjacent to said screening element.

* * * * *